(12) United States Patent  
Jing et al.

(10) Patent No.: US 12,424,930 B2  
(45) Date of Patent: Sep. 23, 2025

(54) ACTIVE SNUBBER CIRCUIT

(71) Applicant: TEXAS INSTRUMENTS INCORPORATED, Dallas, TX (US)

(72) Inventors: Weibing Jing, Beijing (CN); Dan Li, Beijing (CN); Qi Yang, Beijing (CN); Liang Zhang, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 196 days.

(21) Appl. No.: 18/151,644

(22) Filed: Jan. 9, 2023

(65) Prior Publication Data

US 2024/0235380 A1     Jul. 11, 2024

(51) Int. Cl.
    *H02M 1/34*           (2007.01)
    *H02M 3/155*         (2006.01)
    *H03K 17/0814*      (2006.01)

(52) U.S. Cl.
    CPC ...... *H02M 1/344* (2021.05); *H03K 17/08142* (2013.01); *H02M 3/155* (2013.01)

(58) Field of Classification Search
    CPC ........ H02M 1/344; H02M 1/342; H02M 1/34; H03K 17/08142; H03K 17/167; H03K 17/0822; H03K 17/162
    See application file for complete search history.

(56) References Cited

U.S. PATENT DOCUMENTS

| | | | | |
|---|---|---|---|---|
| 5,461,302 A * | 10/1995 | Garcia | ................. | H02M 3/158 |
| | | | | 323/222 |
| 6,023,158 A * | 2/2000 | Liu | ........................ | H02M 1/34 |
| | | | | 323/299 |
| 8,299,841 B2 * | 10/2012 | Fukuhara | ........... | H03K 17/0822 |
| | | | | 327/380 |
| 2011/0013426 A1 * | 1/2011 | Keller | ................... | H02M 3/335 |
| | | | | 363/21.15 |
| 2015/0188411 A1 * | 7/2015 | Lipcsei | ............ | H02M 3/33576 |
| | | | | 363/53 |
| 2016/0072393 A1 * | 3/2016 | Mcintyre | .......... | H02M 3/33584 |
| | | | | 363/21.1 |
| 2017/0279346 A1 * | 9/2017 | Cao | ......................... | H02M 1/34 |
| 2018/0145676 A1 * | 5/2018 | Tran | ............... | H03K 19/017509 |
| 2019/0036445 A1 * | 1/2019 | Muto | ............... | H03K 17/08142 |
| 2021/0320583 A1 * | 10/2021 | Kocon | ..................... | H02M 1/34 |
| 2022/0340020 A1 * | 10/2022 | Papadopoulos | .......... | B60K 1/04 |
| 2024/0030907 A1 | 1/2024 | Okuda | | |

FOREIGN PATENT DOCUMENTS

GB           2597738 A      2/2022
WO     2022210052 A1    10/2022

OTHER PUBLICATIONS

International Search Report mailed May 21, 2024.

* cited by examiner

*Primary Examiner* — Gustavo A Rosario-Benitez
(74) *Attorney, Agent, or Firm* — Charles F. Koch; Frank D. Cimino (57) ABSTRACT

In some examples, an apparatus includes a transistor having a control terminal, in which the transistor is coupled between a power terminal and a ground terminal. The apparatus also includes a resistor. The apparatus also includes a controller having first and second controller inputs and first and second controller outputs, in which the first controller input is coupled to the power terminal, the second controller input is coupled to the control terminal, the first controller output is coupled to the control terminal, and the resistor is coupled between the control terminal and the second controller output.

12 Claims, 8 Drawing Sheets

ACTIVE SNUBBER CIRCUIT

BACKGROUND

A switched mode power supply (SMPS) transfers power from an input power source to a load by switching one or more power transistors or other switching elements coupled through a switch node/terminal to an energy storage element (such as an inductor, an inductance of a transformer, and/or a capacitor), which is capable of coupling to the load. The power transistors can be included in a power converter that includes, or is capable of coupling to, the energy storage element.

SUMMARY

In some examples, an apparatus includes a first transistor having a first control terminal, in which the first transistor is coupled between a power terminal and a ground terminal. The apparatus also includes a second transistor having a second control terminal, in which the second transistor is coupled between the first control terminal and the ground terminal. The apparatus also includes a resistor. The apparatus also includes a third transistor having a third control terminal, in which the third transistor is coupled between the resistor and the ground terminal, and the resistor is coupled between the first control terminal and the third transistor. The apparatus also includes circuitry having first and second inputs and first and second outputs, in which the first input is coupled to the power terminal, the second input is coupled to the first control terminal, the first output is coupled to the second control terminal, and the second output is coupled to the third control terminal.

In some examples, an apparatus includes a transistor having a control terminal, in which the transistor is coupled between a power terminal and a ground terminal. The apparatus also includes a resistor. The apparatus also includes a controller having first and second controller inputs and first and second controller outputs, in which the first controller input is coupled to the power terminal, the second controller input is coupled to the control terminal, the first controller output is coupled to the control terminal, and the resistor is coupled between the control terminal and the second controller output.

In some examples, a system includes a switching regulator having a regulator input and a switch node, the regulator input coupled to a supply voltage terminal. The system also includes a snubber circuit coupled to the switch node. The snubber circuit includes a first transistor having a first control terminal, in which the first transistor is coupled between a power terminal and a ground terminal. The snubber circuit also includes a resistor. The snubber circuit also includes a snubber controller. The snubber controller includes a second transistor having a second control terminal, in which the second transistor is coupled between the first control terminal and the ground terminal. The snubber controller also includes a third transistor having a third control terminal, in which the third transistor is coupled between the resistor and the ground terminal, and the resistor is coupled between the first control terminal and the third transistor. The snubber controller also includes circuitry having first and second inputs and first and second outputs, in which the first input is coupled to the power terminal, the second input is coupled to the first control terminal, the first output is coupled to the second control terminal, and the second output is coupled to the third control terminal.

DETAILED DESCRIPTION

As described above, a SMPS transfers power from an input power source to a load by switching one or more power transistors or other switching elements. The switching of the power transistors of the SMPS can create voltage transients, or ringing, in an output voltage of the SMPS. As a speed at which the power transistors are switched increases, so too may an amplitude of the voltage transients caused by the switching in the output voltage. Large voltage transients, or ringing, may detrimentally affect operation of the SMPS (or the load), may decrease efficiency of an energy conversion between the input power source and the load, or have other adverse effects on the input power source, the SMPS, and/or the load.

Various approaches exist for mitigating the voltage transients, one of which is implementation of a snubber circuit. A snubber circuit limits voltage transients. However, conventional snubber circuit architectures may consume a greater amount of energy than is compatible with reduced power specifications for some devices or application environments for the SMPS.

Examples of this description mitigate transient voltages in an output voltage of a SMPS. The described examples may be implemented as a snubber circuit that mitigates the transient voltages, or ringing. In some examples, the snubber circuit is an active snubber circuit. An active snubber circuit may have certain circuit characteristics that change responsive to changes in the output voltage of the SMPS, in contract to a passive snubber circuit which may be formed of passive circuit elements. The snubber circuit may monitor a value of a voltage of the SMPS in comparison to a target or programmed value. Responsive to the value of the monitored voltage being greater than a value of the target value, the snubber circuit may be activated. Responsive to the value of the output voltage not being greater than the value of the target value, the snubber circuit may be deactivated, thereby reducing power consumption of the snubber circuit and/or a component of the SMPS.

Figure 1:
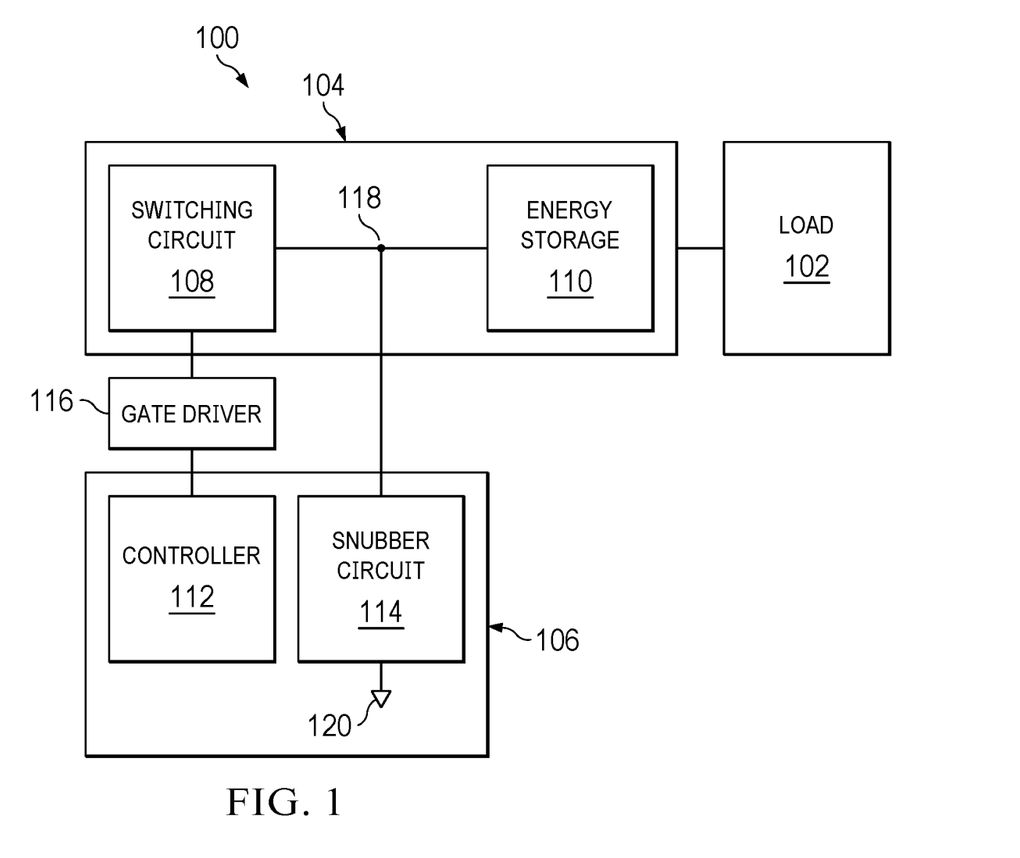
FIG. 1 is a block diagram of a system, in accordance with various examples.

FIG. 1 is a block diagram of a system 100, in accordance with various examples. The system 100 is representative of an application in which power is provided to a load. For example, the system 100 is representative of an automobile or other vehicle, a computing device such as a laptop, a notebook, a server, a smartphone, a tablet, a wearable device, or the like. The system 100 may include a SMPS or other power supply, etc. In an example, the system 100 includes a load 102, a power converter 104, and control circuitry 106. In an example, the power converter 104 is a switching regulator that includes a switching circuit 108 and an energy storage component 110. The control circuitry 106 includes a controller 112 and a snubber circuit 114. Some examples of the system 100 also include a gate driver 116. While shown in FIG. 1 as separate from the power converter 104 and the control circuitry 106, in some examples, the gate driver 116 may be incorporated into the power converter 104 or the control circuitry 106. The components of the system 100 are coupled, in an example, as shown in FIG. 1. In an example, the controller 112 includes any suitable analog, digital, or combination thereof, components for implementing a circuit architecture suitable for determining values of, and providing, gate control signals to the gate driver 116, or gate drive signals to the power converter 104, for controlling switching of the power converter 104.

In an example of operation of the system 100, the power converter 104 receives an input voltage (VDD) from a power source (not shown) and provides an output voltage (VOUT) based on VDD and control exerted on the power converter 104 by the control circuitry 106. The power converter 104 may have any suitable architecture, such as buck, boost, or buck-boost. VOUT is provided to the load 102, such as to power components (not shown) of the load 102, and/or facilitates other operation of the load 102. In an example, the control circuitry 106 controls the power converter 104 according to pulse-frequency modulation (PFM). For example, the control circuitry 106 provides gate control signals that cause the gate driver 116 to provide gate drive signals to the switching circuit 108 to turn switches of the power converter 104 on or off. The gate control signals may be timed such that a switch (not shown) of the switching circuit 108 is on (e.g., in a conductive state) or off (e.g., in a non-conductive state) for an amount of time determined based on a programmed value for VOUT. For example, for a greater value of VOUT with respect to VDD in a buck architecture, the gate control signals may cause the switch of the switching circuit 108 to be on for a longer period of time than for a lesser value of VOUT with respect to VDD.

In an example, the snubber circuit 114 is coupled between a switch node 118 and a ground terminal 120. The switch node 118 is a node of the power converter 104 at which the switching circuit 108 couples to the energy storage component 110. The snubber circuit 114 limits a voltage amplitude and/or rate of voltage increase at the switch node 118. However, in doing so, the snubber circuit 114 increases power loss of the system 100 and therefore decreases efficiency of a power transfer between the power source and the load 102. To mitigate the power loss, the snubber circuit 114 is configured to monitor a voltage (SW) provided at the switch node 118. Responsive to determining that SW has a value greater than a value of a target voltage, the snubber circuit 114 is configured to be active and conduct current from the switch node 118 to the ground terminal 120 to mitigate voltage transients, or ringing, at the switch node 118 and therefore in VOUT. Responsive to determining that SW has a value not greater than the value of the target voltage, the snubber circuit 114 is configured to be inactive and not conduct current from the switch node 118 to the ground terminal 120, thereby reducing power consumption of the snubber circuit 114. For example, power consumption of the snubber circuit 114 between a time at which SW begins to increase in value to a time at which SW is greater in value than the target voltage may be reduced in comparison to other snubber implementations. Such reduction may be achieved via the snubber circuit 114 being inactive during the above time period of increase in value of SW, responsive to the monitoring by the snubber circuit 114 of the value of SW and comparison to the target voltage.

Figure 2:
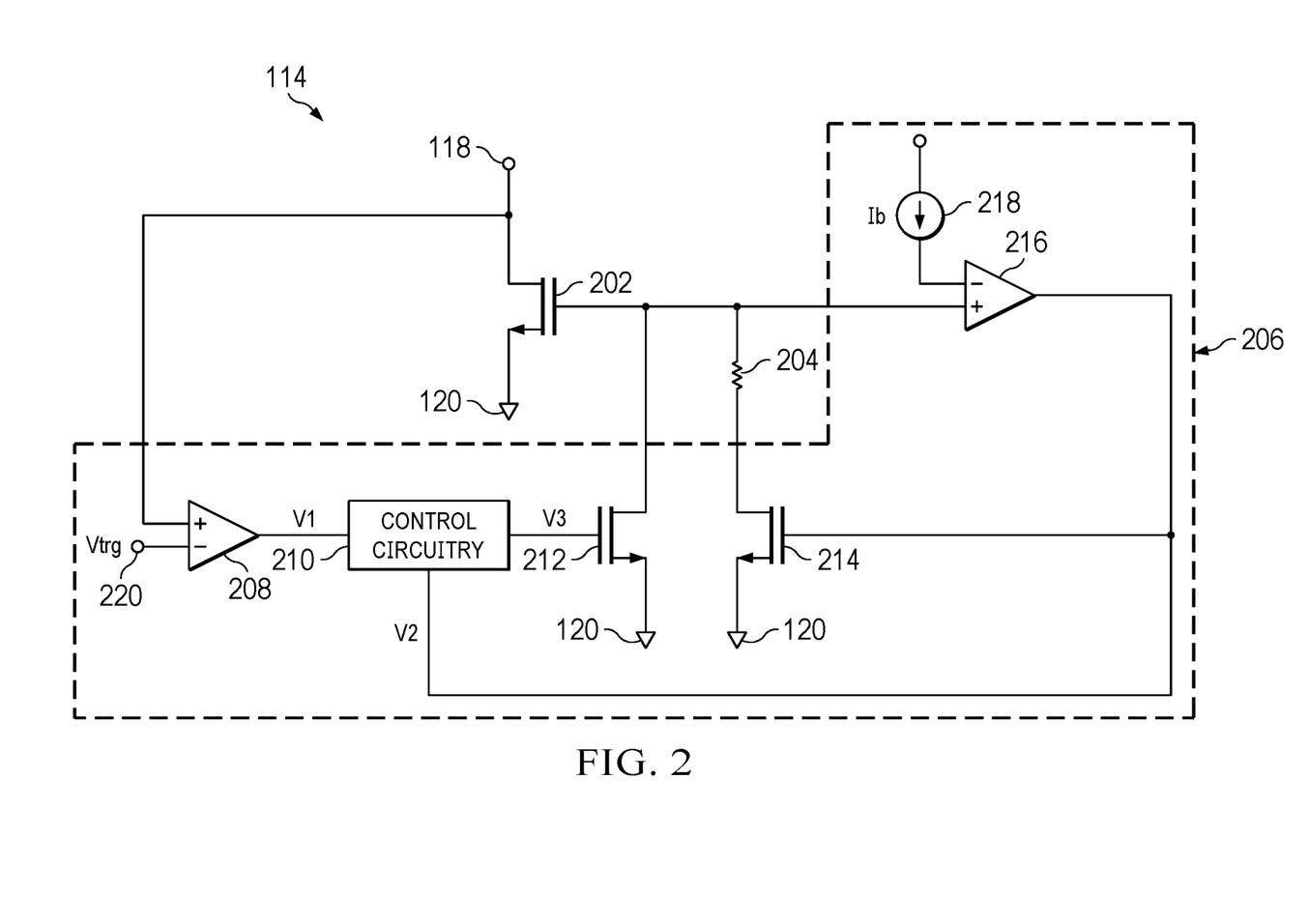
FIG. 2 is a schematic diagram of a snubber circuit, in accordance with various examples.

FIG. 2 is a schematic diagram of the snubber circuit 114, in accordance with various examples. In an example implementation, the snubber circuit 114 includes a snubber transistor 202, a snubber resistor 204, and a snubber controller 206. The snubber controller 206 includes a comparator 208, control circuitry 210, a transistor 212, a transistor 214, a comparator 216, and a bias source 218. In an example architecture of the snubber circuit 114, the snubber transistor 202 has a drain coupled to the switch node 118, a source coupled to the ground terminal 120, and a gate. As used herein, a gate of a transistor may be referred to as a control terminal of the transistor. The snubber resistor 204 is coupled between the gate of the snubber transistor 202 and the snubber controller 206. The comparator 208 has a first input coupled to the switch node 118, a second input coupled to a target voltage terminal 220, and an output. The control circuitry 210 has a first input coupled to the output of the comparator 208, a second input, and an output. The transistor 212 has a drain coupled to the gate of the snubber transistor 202, a source coupled to the ground terminal 120, and a gate coupled to the output of the control circuitry 210. The transistor 214 has a drain coupled to the snubber resistor 204 (e.g., coupled through the snubber resistor 204 to the gate of the snubber transistor 202), a source coupled to the ground terminal 120, and a gate. The comparator 216 has a first input coupled to the gate of the snubber transistor 202, a second input, and an output coupled to the gate of the transistor 214 and the second input of the control circuitry 210. The bias source 218 is coupled to the second input of the comparator 216.

In an example of operation of the snubber circuit 114 of FIG. 2, SW increases in value based on a switching behavior of the switching circuit 108 and the energy storage component 110, under control of the controller 112. Responsive to SW increasing in value to exceed the value of the target voltage (Vtrg), a signal (V1) provided at the output of the comparator 208 has an asserted value, such as a value of logic 1. Otherwise, the signal provided at the output of the comparator 208 has a deasserted value, such as a value of logic 0 (e.g., responsive to SW being less in value that Vtrg). As SW increases in value, so too does a current flowing through the snubber transistor 202. Responsive to the current flowing through the snubber transistor 202 increasing in value to exceed a value of a bias current (Ib) provided via the bias source 218, a signal (V2) provided at the output of the comparator 216 has an asserted value, such as a value of logic 1. Otherwise, the signal provided at the output of the comparator 216 has a deasserted value, such as a value of logic 0 (e.g., responsive to the current flowing through the snubber transistor 202 being lesser in value than Ib). In some examples, the bias source 218 is a current source that provides Ib. In other examples, the bias source 218 is a resistor that is coupled between a voltage source (now shown) and the comparator 216.

Based on the signals provided by the comparator 208 and the comparator 216, the control circuitry 210 determines and provides a signal (V3) to the gate of the transistor 212 to control conductivity of the transistor 212. The transistor 212 and the transistor 214, together with the snubber resistor 204, control a resistance provided at the gate of the snubber transistor 202, and therefore control turning the snubber transistor 202 on or off. For example, responsive to V2 having an asserted value, a gate-to-source voltage (Vgs) of the transistor 214 has a value sufficiently high as to cause the transistor 214 to turn on, and current to flow between its drain and source. During the period in which the transistor 214 is turned on, current sinks from the gate of the snubber transistor 202 through the snubber resistor 204 and the transistor 214, discharging the gate voltage of the snubber transistor 202 to the ground terminal 120. Responsive to V2 transitioning to have a deasserted value, the transistor 214 is turned off and the control circuitry 210 provides V3 having an asserted value. Responsive to V3 having the asserted value, Vgs of the transistor 212 has a value sufficiently high as to cause the transistor 212 to turn on, and current to flow between its drain and source, thereby holding the gate of the snubber transistor 202 at a ground potential (e.g., a potential provided at ground terminal 120).

Figure 3:
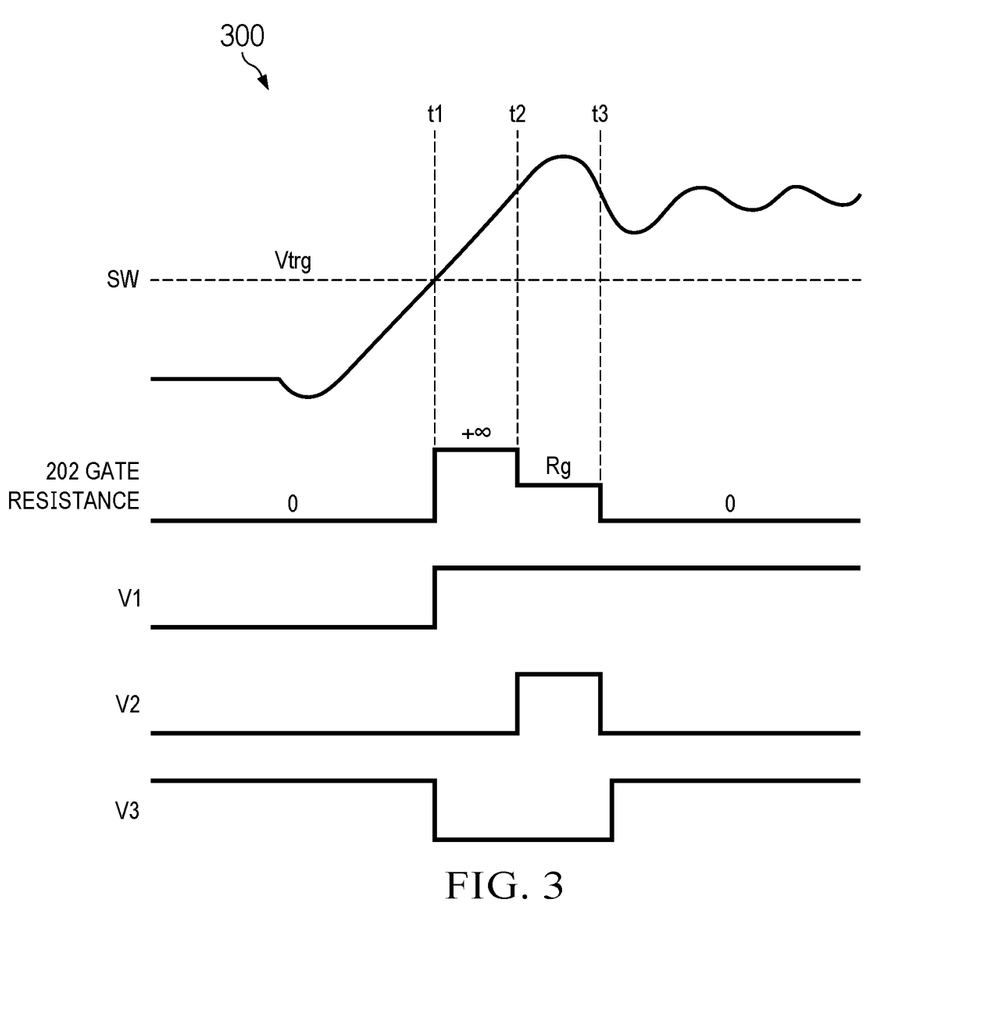
FIG. 3 is a timing diagram of signals in a snubber circuit, in accordance with various examples.

FIG. 3 is a timing diagram 300 of signals in a snubber circuit, in accordance with various examples. In some examples, the diagram 300 is representative of signals that may be provided in the snubber circuit 114 of FIG. 2. The diagram 300 includes SW, Vtrg, V1, V2, V3, and a resistance (Rg) of the snubber resistor 204 as seen at the gate of the snubber transistor 202.

As shown by the diagram 300 and described above with respect to FIG. 2, responsive to SW increasing in value to exceed Vtrg at time t1, V1 is asserted. Similarly, V2 is asserted at time t2 responsive to a current flowing through the snubber transistor 202 increasing to exceed Ib (neither shown). Responsive to assertion of V2, the transistor 214 becomes conductive, sinking current through the snubber resistor 204 and the transistor 214 from the gate of the snubber transistor 202. Based on the combinational logic of the control circuitry 210, V3 is determined based on V1 and V2, with conductivity of the transistor 212 controlled according to V3. Responsive to current being sunk from the gate of the snubber transistor 202 through the snubber resistor 204 and the transistor 214, the current flowing through the snubber transistor 202 decreases. Responsive to the value of the current flowing through the snubber transistor 202 decreasing to be less in value than Ib at time t3, V2 is deasserted and the transistor 214 is turned off. Responsive to deassertion of V2 (e.g., the occurrence of a falling edge in V2) and V1 having an asserted value, V3 becomes asserted and the transistor 212 is turned on, holding the gate of the snubber transistor 202 at a ground potential, as described above with respect to FIG. 2.

Figure 4:
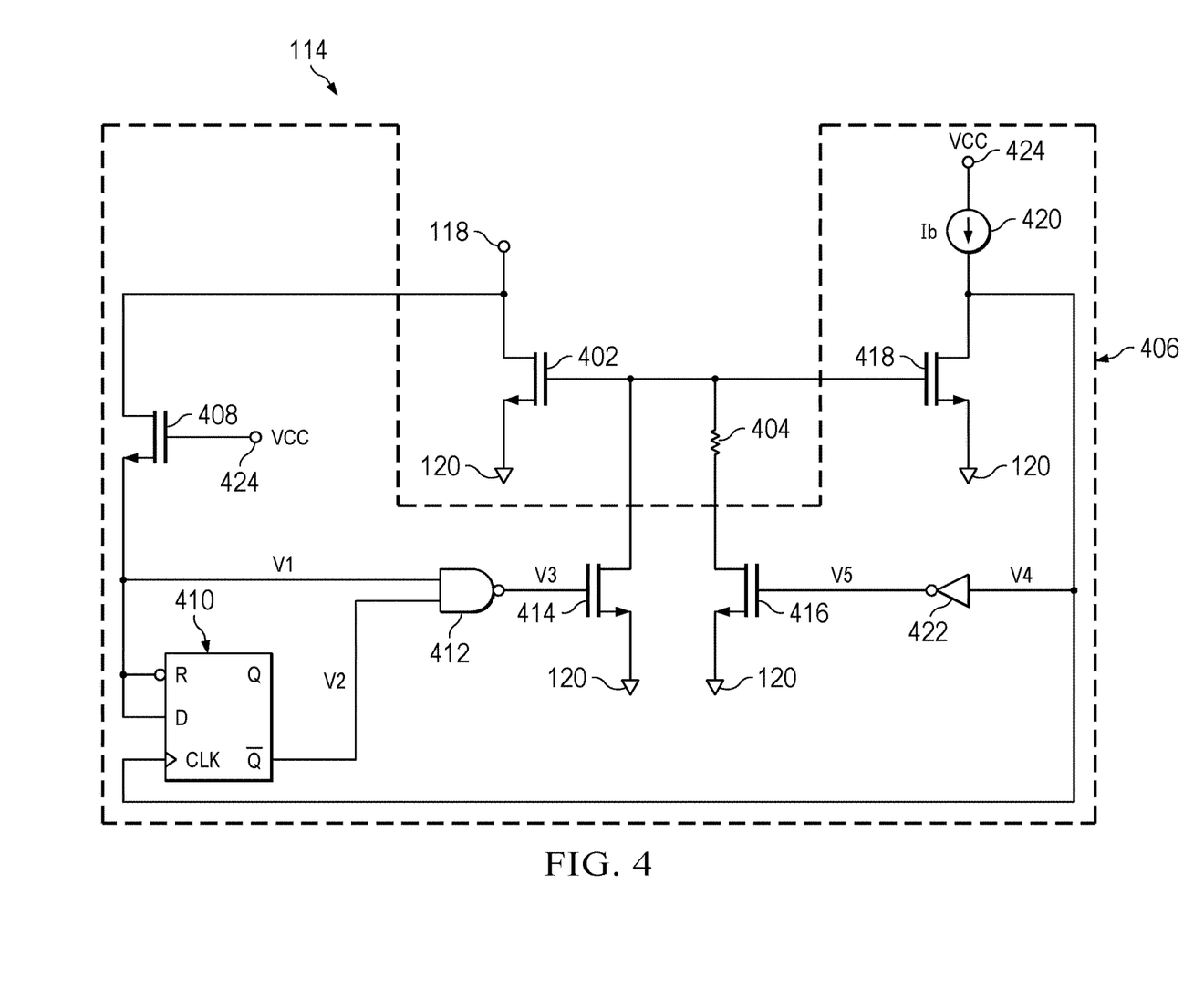
FIG. 4 is a schematic diagram of a snubber circuit, in accordance with various examples.

FIG. 4 is a schematic diagram of the snubber circuit 114, in accordance with various examples. In an example implementation, the snubber circuit 114 includes a snubber transistor 402, a snubber resistor 404, and a snubber controller 406. The snubber controller 406 includes a transistor 408, control circuitry 410, a logic circuit 412, a transistor 414, a transistor 416, a transistor 418, a bias source 420, and a logic circuit 422. In an example architecture of the snubber circuit 114, the snubber transistor 402 has a drain coupled to the switch node 118, a source coupled to the ground terminal 120, and a gate. The snubber resistor 404 is coupled between the gate of the snubber transistor 402 and the snubber controller 406. The transistor 408 has a drain coupled to the switch node 118, a gate coupled to a supply voltage terminal 424, and a source. The control circuitry 410 has a data input coupled to the source of the transistor 408, a reset input coupled to the source of the transistor 408, a clock input, and an inverted data output. In some examples, the control circuitry 410 is implemented as a latch, such as a d-flip flop. The logic circuit 412 has a first input coupled to the source of the transistor 408, a second input coupled to the inverted data output of the control circuitry 410, and an output. In some examples, the logic circuit 412 is a NAND digital logic gate, or a circuit capable of performing a NAND operation. The transistor 414 has a drain coupled to the gate of the snubber transistor 402, a source coupled to the ground terminal 120, and a gate coupled to the output of the logic circuit 412. The transistor 416 has a drain coupled to the snubber resistor 404 (e.g., coupled through the snubber resistor 404 to the gate of the snubber transistor 402), a source coupled to the ground terminal 120, and a gate. The transistor 418 has a gate coupled to the gate of the snubber transistor 402, a source coupled to the ground terminal 120, and a drain coupled to the clock input of the control circuitry 410. The bias source 420 is coupled between the supply voltage terminal 424 and the drain of the transistor 418. The logic circuit 422 has an input coupled to the drain of the transistor 418 and an output coupled to the gate of the transistor 416. In some examples, the logic circuit 422 is a NOT digital logic gate (e.g., an inverter), or a circuit capable of performing a NOT (e.g., inversion) operation.

In an example of operation of the snubber circuit 114 of FIG. 4, responsive to SW having a low value, such as a value of logic 0, a voltage (V1) provided at the source of the transistor 408 also has a low value. In some examples, a supply voltage (VCC) provided at the supply voltage terminal 424 has a value sufficiently larger than SW to hold the transistor 408 in a conductive state, providing a signal based on, and having a value approximately the same as, SW at the source of the transistor 408. V1 having the low value causes the control circuitry 410 to enter a reset mode and provide a voltage (V2) at the inverted data output having a low value. Based on V1 and V2 both having low values, the logic circuit 412 provides a voltage (V3) at the output of the logic circuit 412 having a high value. The high value of V3 causes the transistor 414 to become conductive, sinking current from the gate of the snubber transistor 402 to the ground terminal 120. The current being sunk from the gate of the snubber transistor 402 is also sunk from the gate of the transistor 418, causing the transistor 418 to turn off and become non-conductive between its drain and source. A bias current (Ib) provided by the bias source 420 has a value sufficiently large to cause a voltage (V4) to exist at the input of the logic circuit 422 having a high value, and correspondingly a voltage (V5) provided at the output of the logic circuit 422 to have a low value. The low value of V5 is insufficient to cause the transistor 416 to become conductive between its drain and source, thereby causing the transistor 416 to be off. Because the transistor 416 is off, the snubber resistor 404 is part of an open circuit and has no effect on the gate resistance of the snubber transistor 402. As a result, the gate resistance of the snubber transistor 402 is controlled via the coupling between the gate of the snubber transistor 402 and ground through the transistor 414, causing the gate resistance of the snubber transistor 402 to be approximately zero.

Responsive to SW increasing in value, V1 increases in value proportionally to SW. Responsive to V1 increasing in value to transition from a low value to a high value, the logic circuit 412 provides V3 having a low value. The low value of V3 causes the transistor 414 to turn off, becoming nonconductive between its drain and source. The transistor 416 is also nonconductive, as described above, causing the gate resistance of the snubber transistor 402 to have a comparatively large resistance, approximate as infinite, resulting from the gate of the snubber transistor 402 being a floating node (e.g., a high impedance node having an unknown or uncontrolled value). As SW continues to increase in value, gate-to-drain capacitive coupling of the snubber transistor 402 causes the snubber transistor 402 to turn on and become conductive between its source and drain. The voltage caused at the gate of the snubber transistor 402 resulting from the gate-to-drain capacitive coupling is also provided at the gate of the transistor 418, which causes the transistor 418 to turn on and become conductive between its drain and source. Ib is sunk through the transistor 418 to the ground terminal 120, causing V4 to have a low value and, correspondingly, V5 to have a high value. The high value of V5 causes the transistor 416 to turn on, causing a gate resistance of the snubber transistor 402 to be approximately equal to a resistance of the snubber resistor 404.

The snubber resistor 404 sinks current from the gate of the snubber transistor 402 until a voltage at the gate of the snubber transistor 402 is insufficient to maintain the snubber transistor 402 in a conductive state and the snubber transistor 402 turns off. Correspondingly, the transistor 418 also turns off. Responsive to the transistor 418 turning off, Ib again causes V4 to have a high value and V5 to, correspondingly, have a low value, as described above. The low value of V5 causes the transistor 416 to turn off and removes an effect of the snubber resistor 404 on the gate resistance of the snubber transistor 402, also as described above. The transition of V4 from the low value to the high value also clocks the control circuitry 410, causing the control circuitry 410 to provide V2 having a low value. Based on the high value of V1 and the low value of V2, the logic circuit 412 again provides V3 having a high value, turning on the transistor 414, as described above. Operation of the snubber circuit 114 continues as described above following turn-on of the transistor 414 until transients in SW are reduced such that SW no longer increases to a value sufficient to cause the snubber transistor 402 to turn on because of the gate-to-drain capacitive coupling of the snubber transistor 402.

Figure 5:
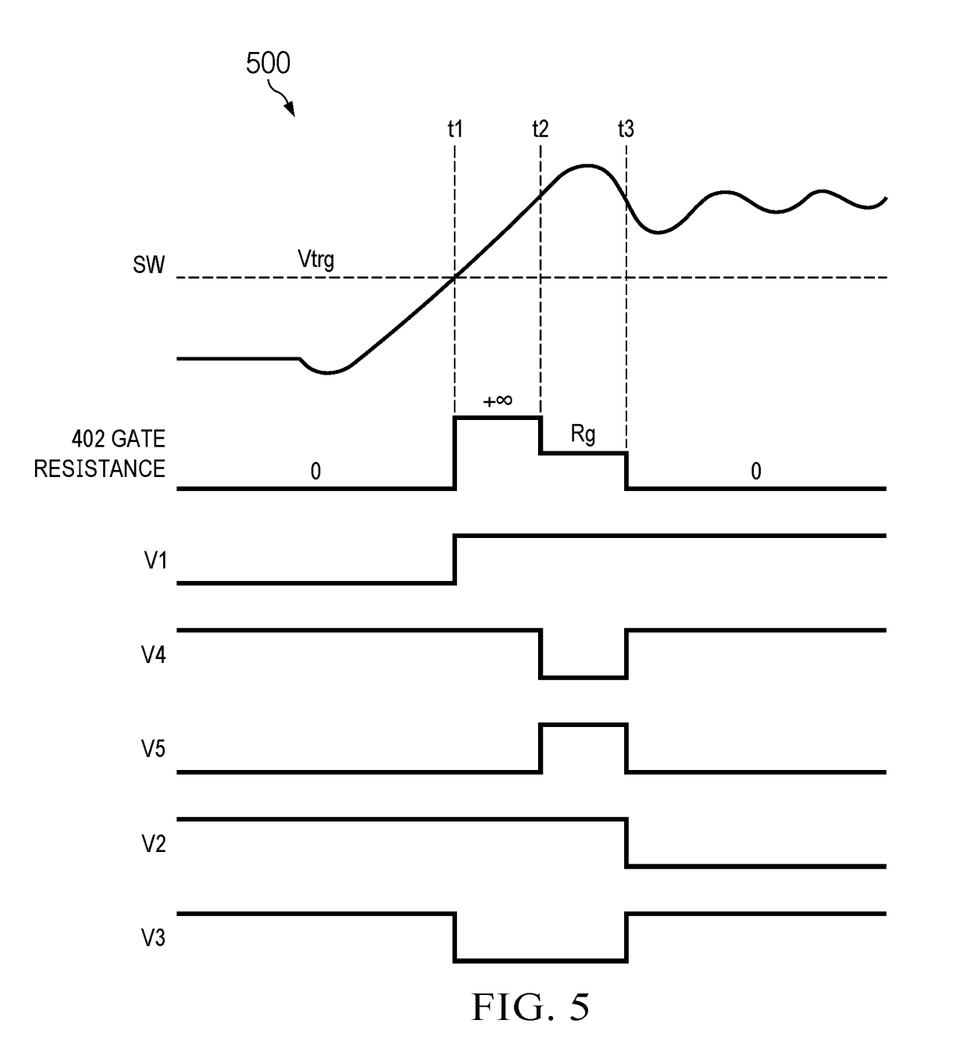
FIG. 5 is a timing diagram of signals in a snubber circuit, in accordance with various examples.

FIG. 5 is a timing diagram 500 of signals in a snubber circuit, in accordance with various examples. In some examples, the diagram 500 is representative of signals that may be provided in the snubber circuit 114 of FIG. 4. The diagram 500 includes SW, Vtrg, V1, V2, V3, , V4, and V5 and a resistance (Rg) of the snubber resistor 404 as seen at the gate of the snubber transistor 402.

As shown by the diagram 500 and described above with respect to FIG. 4, responsive to SW increasing in value to exceed Vtrg at time t1, V1 is asserted. V2 has a value determined based on operation of the control circuitry 410 such that an inverse of a value of V1, as received by the control circuitry 410 concurrent with a rising edge in V4, is provided as the value of V2. Responsive to both V1 and V2 having asserted values, V3 is provided having a deasserted value. Responsive to either V1 or V2, or both V1 and V2, having deasserted values, V3 is provided having an asserted value. Responsive to a current flowing through the snubber transistor 402 increasing to exceed Ib (neither shown) at time t2, V4 is deasserted. Responsive to deassertion of V4, V5 is provided having an asserted value and vice versa, such that V4 and V5 have values that are inverses. Responsive to assertion of V5, the transistor 416 becomes conductive, sinking current through the snubber resistor 404 and the transistor 416 from the gate of the snubber transistor 402. Responsive to current being sunk from the gate of the snubber transistor 402 through the snubber resistor 404 and the transistor 416, the current flowing through the snubber transistor 402 decreases. Responsive to the value of the current flowing through the snubber transistor 402 decreasing to be less in value than Ib at time t3, V4 is asserted, V5 is deasserted, and the transistor 416 is turned off. Responsive to deassertion of V5 (e.g., the occurrence of a falling edge in V5) and either V1 or V2, or both V1 and V2, having deasserted values, V3 becomes asserted and the transistor 414 is turned on, holding the gate of the snubber transistor 402 at a ground potential, as described above with respect to FIG. 4.

Figure 6:
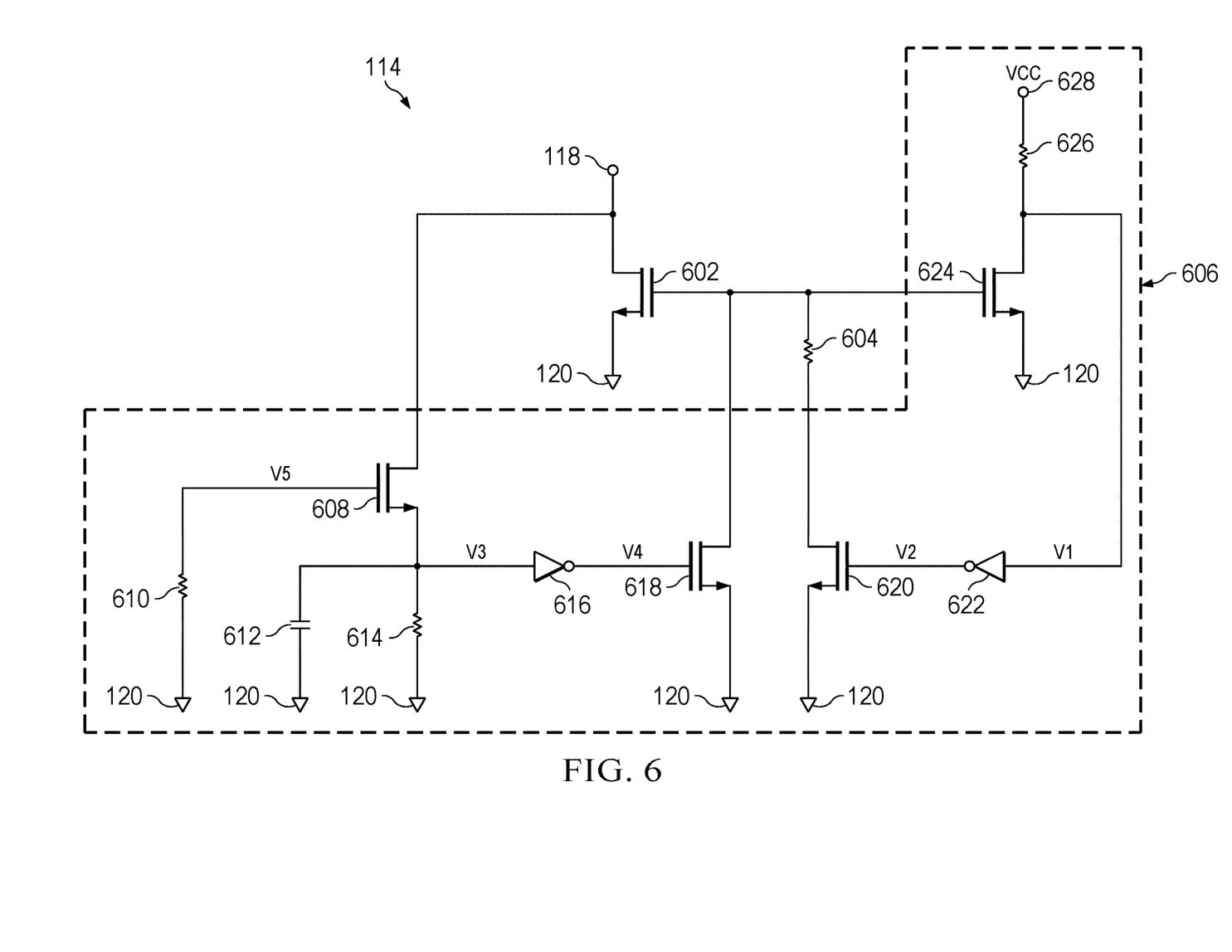
FIG. 6 is a schematic diagram of a snubber circuit, in accordance with various examples.

FIG. 6 is a schematic diagram of the snubber circuit 114, in accordance with various examples. In an example implementation, the snubber circuit 114 includes a snubber transistor 602, a snubber resistor 604, and a snubber controller 606. The snubber controller 606 includes a transistor 608, a resistor 610, a capacitor 612, a resistor 614, a logic circuit 616, a transistor 618, a transistor 620, a logic circuit 622, a transistor 624, and a resistor 626. In an example architecture of the snubber circuit 114, the snubber transistor 602 has drain coupled to the switch node 118, a source coupled to the ground terminal 120, and a gate. The snubber resistor 604 is coupled between the gate of the snubber transistor 602 and the snubber controller 606. The transistor 608 has a drain coupled to the switch node 118, a gate coupled to the ground terminal 120 through the resistor 610, and a source. The capacitor 612 and the resistor 614 are each coupled between the source of the transistor 608 and the ground terminal 120. The logic circuit 616 has an input coupled to the source of the transistor 608 and an output. In some examples, the logic circuit 616 is a NOT digital logic gate (e.g., an inverter), or a circuit capable of performing a NOT (e.g., inversion) operation. The transistor 618 has a drain coupled to the source of the snubber transistor 602, a gate coupled to the output of the logic circuit 616, and a source coupled to the ground terminal 120. The transistor 620 has a drain coupled to the snubber resistor 604 (e.g., coupled through the snubber resistor 604 to the gate of the snubber transistor 602), a source coupled to the ground terminal 120, and a gate. The logic circuit 622 has an output coupled to the gate of the transistor 620 and an input. In some examples, the logic circuit 622 is a NOT digital logic gate (e.g., an inverter), or a circuit capable of performing a NOT (e.g., inversion) operation. The transistor 624 has a gate coupled to the gate of the snubber transistor 602, a source coupled to the ground terminal 120, and a drain coupled through the resistor 626 to a supply voltage terminal 628.

In an example of operation of the snubber circuit 114 of FIG. 6, responsive to SW having a low value, such as a value of logic 0, the gate of the transistor 608 is held at a ground potential through the resistor 610 such that the transistor 608 is turned off to cause V3 to have a low value, and V4 to have a high value, such as a value of logic 1. Similarly, the snubber transistor 602 is turned off, the transistor 624 is turned off, V1 is held at a high value through the resistor 626, and V2 has a low value. The low value of V2 causes the transistor 620 to be turned off. Conversely, the high value of V4 causes the transistor 618 to be turned on, holding the gate of the snubber transistor 602 at the ground potential to keep the snubber transistor 602 turned off.

Responsive to SW increasing in value to have a high value, drain-to-gate capacitive coupling causes V5 to increase, turning on the transistor 608. Responsive to the transistor 608 turning on, V3 has an asserted value and V4 has a deasserted value, turning off the transistor 618. Drain-to-gate capacitive coupling of the snubber transistor 602 also causes energy to couple from the switch node 118 to the gate of the snubber transistor 602, causing the snubber transistor 602 to turn on and sink current from the switch node 118. The energy provided at the gate of the snubber transistor 602 is also provided at the gate of the transistor 624, causing the transistor 624 to turn on, pulling V1 down to have a low value and V2 to correspondingly have a high value. The high value of V2 causes the transistor 620 to turn. Responsive to the transistor 620 turning on, a gate resistance of the snubber transistor 602 (e.g., a resistance as seen at the gate of the snubber transistor 602) is approximately equal to a resistance of the snubber resistor 604. Current at the gate of the snubber transistor 602 is sunk through the snubber resistor 604 and the transistor 620 to the ground terminal 120, slowly reducing the current at the gate of the snubber transistor 602 until the snubber transistor 602 and the transistor 624 turn off.

V5 decreases in value, with current discharging to the ground terminal 120 through the resistor 610 until a value of V5 is insufficient to maintain the transistor 608 in a conductive state and the transistor 608 turns off. Responsive to the transistor 608 turning off, V3 begins to discharge through the resistor 614 to the ground terminal 120 at a rate determined according to a capacitance of the capacitor 612 and a resistance of the resistor 614. Responsive to the value of V3 decreasing below a threshold to transfer from a high value to a low value, V4 is asserted as a high value and the transistor 618 turns on, as described above, and the gate of the snubber transistor 602 is pulled low to the ground potential. Similarly, responsive to the transistor 624 turning off, V1 is pulled high through the resistor 626 to have the high value, causing V2 to have a low value and the transistor 620 to be turned off.

Figure 7:
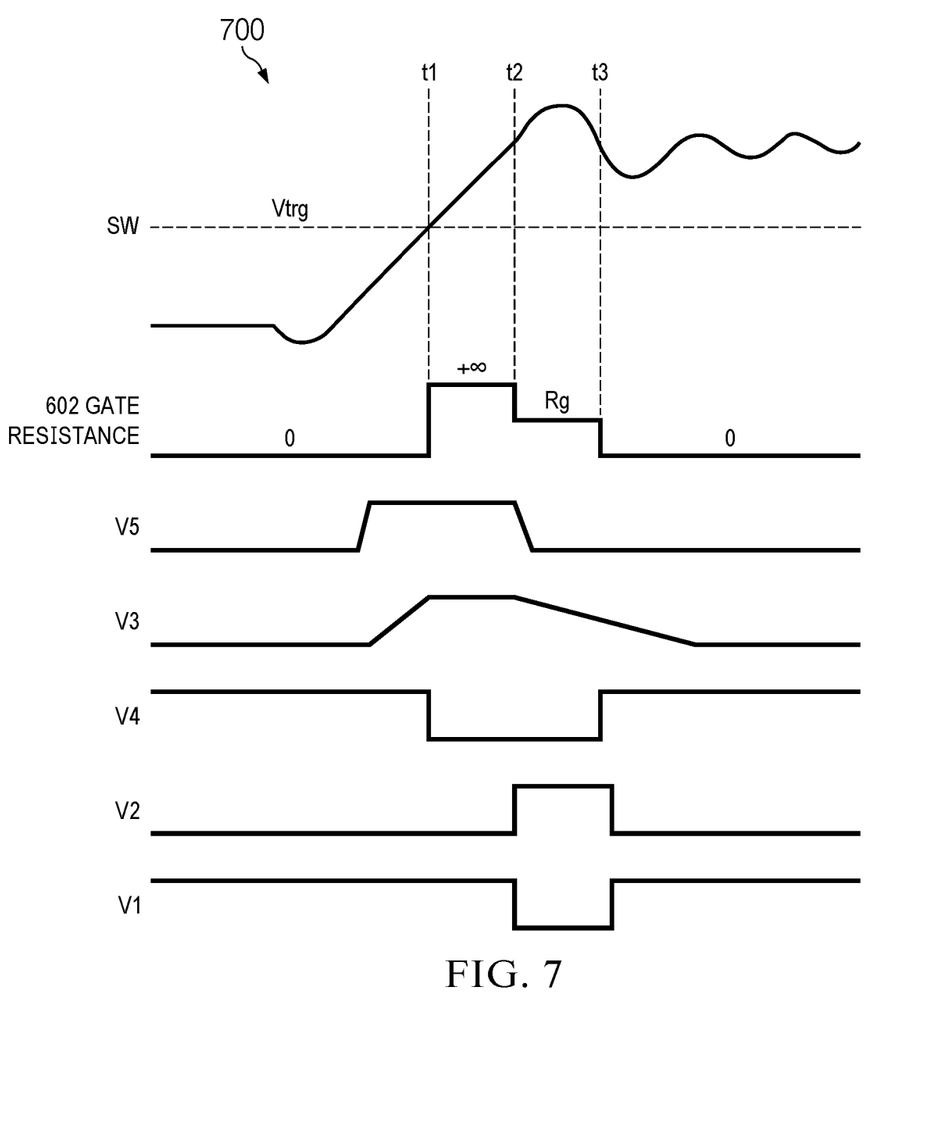
FIG. 7 is a timing diagram of signals in a snubber circuit, in accordance with various examples.

FIG. 7 is a timing diagram 700 of signals in a snubber circuit, in accordance with various examples. In some examples, the diagram 700 is representative of signals that may be provided in the snubber circuit 114 of FIG. 6. The diagram 700 includes SW, Vtrg, V1, V2, V3, V4, and V5 and a resistance (Rg) of the snubber resistor 604 as seen at the gate of the snubber transistor 602.

As shown by the diagram 700 and described above with respect to FIG. 6, responsive to SW increasing in value, V3 and V5 increase in value. Responsive to the value of SW increasing to exceed Vtrg at time t1, V4 is deasserted. Responsive to deassertion of V4, the gate of the snubber transistor 602 is regarded as a high impedance floating node. Responsive to SW further increasing in value, at time t2 V1 is deasserted, and V2 is asserted. Also at time t2, the snubber transistor 602 turns on to sink current of SW to the ground terminal 120. Responsive to SW decreasing in value and V5 discharging, as described above, and decreasing to have a low value, V3 begins discharging. Responsive to assertion of V2, the transistor 620 becomes conductive, sinking current through the snubber resistor 604 and the transistor 620 from the gate of the snubber transistor 602 until such time as the snubber transistor 602 and the transistor 624 turn off, causing V1 to be asserted and V2 to be deasserted at time t3. Responsive to deassertion of V2, the transistor 620 is turned off. Also at t3, responsive to V3 discharging to have a value less than a threshold for having a low value, V4 is asserted as a high value. Responsive to assertion of V4, the transistor 618 is turned on, holding the gate of the snubber transistor 602 at a ground potential, as described above with respect to FIG. 6.

Figure 8:
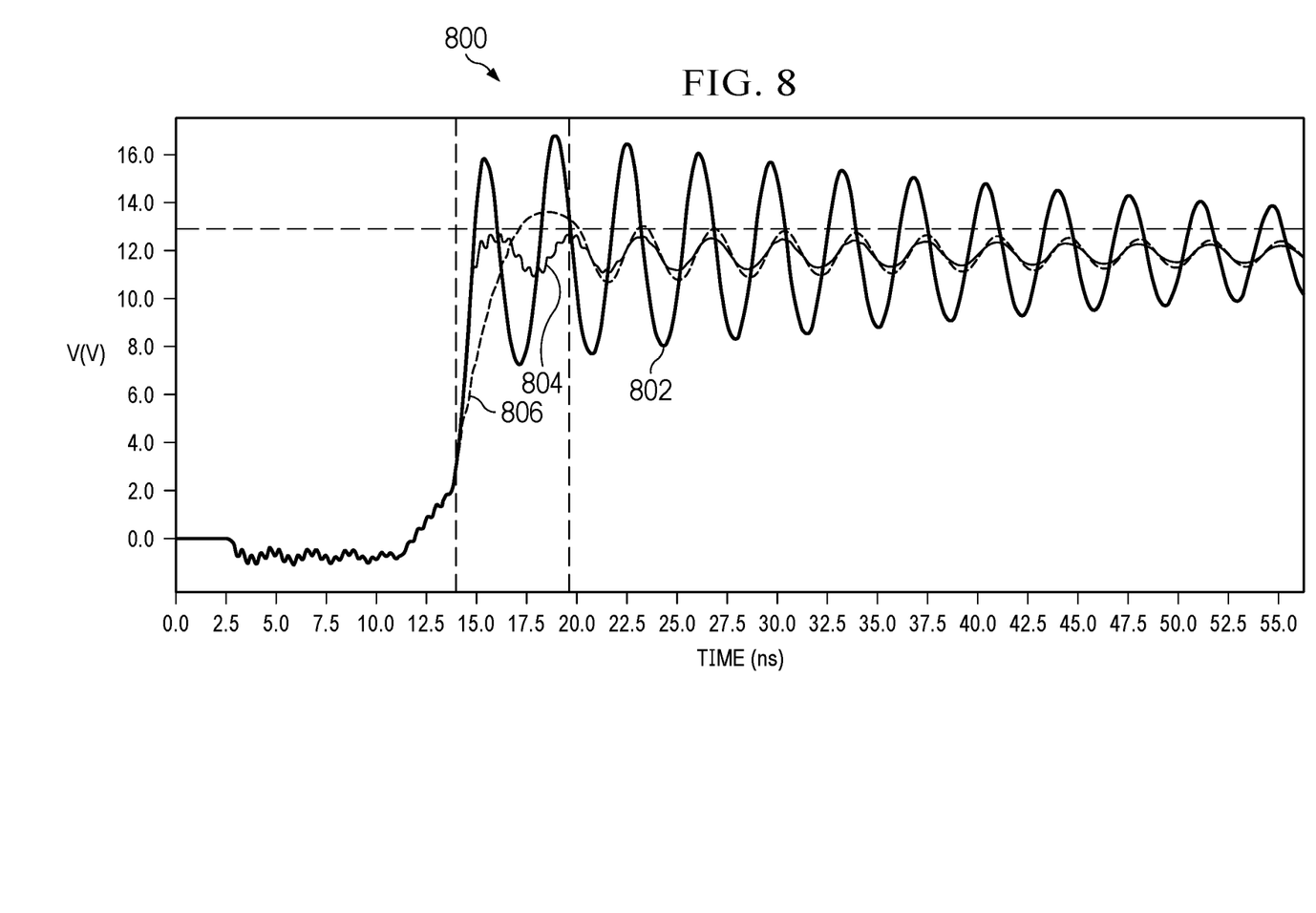
FIG. 8 is a timing diagram of signals in a system, in accordance with various examples.

FIG. 8 is a timing diagram 800 of signals in a system, in accordance with various examples. In some examples, the diagram 800 is representative of signals in the system 100 including a signal 802 of SW voltage over time for a system including a snubber circuit (such as the snubber circuit 114) based on the teachings of this description, a signal 804 of SW voltage over time for a system including a snubber circuit not according to the teachings of this description, and a signal 806 of SW voltage over time for a system in the absence of a snubber circuit. In the diagram 800, the vertical axis is representative of voltage in units of volts (V) and the horizontal axis is representative of time in units of nanoseconds (ns).

As shown by the signals 804, 806 in comparison to the signal 802, an amplitude of SW is decreased through implementation of a snubber circuit coupled to the switch node 118. As shown by the signal 804 in comparison to the signal 806, the snubber circuit 114 according to this description has a faster slew rate than other snubber circuit architectures and reduces an amplitude of SW more rapidly than other snubber circuit architectures.

In this description, the term "couple" may cover connections, communications, or signal paths that enable a functional relationship consistent with this description. For example, if device A provides a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a value means +/−10 percent of that parameter. Modifications are possible in the described examples, and other examples are possible within the scope of the claims.

What is claimed is:

1. An apparatus, comprising:
a first transistor having a first control terminal, in which the first transistor is coupled between a power terminal and a ground terminal;
a second transistor having a second control terminal, in which the second transistor is coupled between the first control terminal and the ground terminal;
a resistor;
a third transistor having a third control terminal, in which the third transistor is coupled between the resistor and the ground terminal, and the resistor is coupled between the first control terminal and the third transistor; and
circuitry having first and second inputs, in which the first input is coupled to the power terminal and the second input is coupled to the first control terminal;
wherein the circuitry includes:
a third input, in which the third input is a target voltage input;
a first comparator having a first comparator output and first and second comparator inputs, in which the first comparator input is coupled to the power terminal, and the second comparator input is coupled to the third input; and
control circuitry having a control circuitry output and first and second control circuitry inputs, in which the first control circuitry input is coupled to the first comparator output, and the control circuitry output is coupled to the second control terminal.

2. The apparatus of claim 1, wherein the circuitry includes a fourth input, in which the fourth input is a bias current input.

3. The apparatus of claim 2, wherein
the circuitry includes a second comparator having a second comparator output and third and fourth comparator inputs, in which the third comparator input is coupled to the first control terminal, and the fourth comparator input is coupled to the fourth input; and
the second control circuitry input is coupled to the second comparator output.

4. The apparatus of claim 3, wherein the circuitry is configured to:
couple the first control terminal to the ground terminal during a first time period through the second transistor; and
couple the first control terminal to the ground terminal during a second time period through the resistor and the third transistor.

5. The apparatus of claim 4, wherein to couple the first control terminal to the ground terminal during the first time period, the circuitry is configured to:
compare a switch voltage provided at the power terminal to a target voltage provided at the target voltage input to provide a first comparison result;
compare a current provided at the first control terminal to a bias current provided at the bias current input to provide a second comparison result; and
control the first transistor to couple the first control terminal to the ground terminal responsive to the first comparison result having an asserted value and the second comparison result having a deasserted value.

6. The apparatus of claim 4, wherein to couple the first control terminal to the ground terminal during the second time period, the circuitry is configured to:
compare a switch voltage provided at the power terminal to a target voltage provided at the target voltage input to provide a first comparison result;
compare a current provided at the first control terminal to a bias current provided at the bias current input to provide a second comparison result; and
control the third transistor to couple the first control terminal to the ground terminal through the resistor responsive to the second comparison result having an asserted value.

7. The apparatus of claim 6, wherein responsive to the second comparison result having the asserted value, the control circuitry is configured to provide a deasserted signal at the second control terminal.

8. An apparatus, comprising:
a transistor having a control terminal, in which the transistor is coupled between a power terminal and a ground terminal;
a resistor coupled to the transistor; and
a controller having first and second controller inputs, in which the first controller input is coupled to the power terminal and the second controller input is coupled to the control terminal,
wherein the controller is capable of:
comparing a switch voltage provided at the power terminal to a target voltage to provide a first comparison result;
comparing a current provided at the control terminal to a bias current to provide a second comparison result;
coupling the control terminal to the ground terminal responsive to the first comparison result having an asserted value and the second comparison result having a deasserted value; and
coupling the control terminal to the ground terminal through the resistor responsive to the second comparison result having an asserted value.

9. The apparatus of claim 8, wherein the controller is capable of:
coupling the control terminal to the ground terminal during a first time period; and
coupling the control terminal to the ground terminal through the resistor during a second time period.

10. A system, comprising:
a switching regulator having a regulator input and a switch node, the regulator input coupled to a supply voltage terminal; and
a snubber circuit coupled to the switch node, the snubber circuit including:
a first transistor having a first control terminal, in which the first transistor is coupled between a power terminal and a ground terminal;
a resistor; and
a snubber controller, including:
a second transistor having a second control terminal, in which the second transistor is coupled between the first control terminal and the ground terminal;
a third transistor having a third control terminal, in which the third transistor is coupled between the resistor and the ground terminal, and the resistor is coupled between the first control terminal and the third transistor; and circuitry having first and second inputs, in which the first input is coupled to the power terminal and the second input is coupled to the first control terminal;

wherein the circuitry of the snubber controller includes:

a first comparator having a first comparator output and first and second comparator inputs, in which the first comparator input is coupled to the power terminal, and the second comparator input is coupled to a target voltage input;

control circuitry having a control circuitry output and first and second control circuitry inputs, in which the first control circuitry input is coupled to the first comparator output, and the control circuitry output is coupled to the second control terminal.

11. The system of claim 10, wherein the circuitry of the snubber controller includes:

a second comparator having a second comparator output and third and fourth comparator inputs, in which the third comparator input is coupled to the first control terminal, and the fourth comparator input is coupled to a bias current input; and the second control circuitry input is coupled to the second comparator output.

12. The system of claim 10, wherein the circuitry of the snubber controller is configured to:

couple the first control terminal to the ground terminal during a first time period through the second transistor; and couple the first control terminal to the ground terminal during a second time period through the resistor and the third transistor.

* * * * *